United States Patent [19]

Buchwald

[11] Patent Number: 4,975,643
[45] Date of Patent: Dec. 4, 1990

[54] MEASUREMENT AND CONTROL OF MAGNETOSTRICTIVE TRANSDUCER MOTION USING STRAIN SENSORS

[75] Inventor: Warren G. Buchwald, Marshalltown, Iowa

[73] Assignee: Fisher Controls International, Inc., Clayton, Mo.

[21] Appl. No.: 333,538

[22] Filed: Apr. 5, 1989

[51] Int. Cl.$^5$ .......................... G01B 7/14; G01B 7/16; H02N 2/00; G01R 33/18
[52] U.S. Cl. .................................. 324/207.12; 73/760; 73/766; 318/118; 324/207.13; 324/207.22; 324/209; 324/226; 335/215
[58] Field of Search ............... 324/207, 208, 209, 226, 324/260, 235, 225; 73/779, 862.36, 760, 766, 767, 768, 778, 781, 805; 335/215; 318/118, 646, 652; 310/26

[56] References Cited

U.S. PATENT DOCUMENTS

| | | | |
|---|---|---|---|
| 2,053,560 | 9/1936 | Janovsky | 177/351 |
| 2,183,078 | 12/1939 | Kemler | 265/1 |
| 2,231,702 | 2/1941 | Burgwin et al. | 73/51 |
| 2,275,532 | 3/1942 | Lamberger et al. | 265/1 |
| 2,298,216 | 10/1942 | Lamberger et al. | 265/1 |
| 2,780,774 | 2/1957 | Epstein | 324/209 X |
| 2,849,669 | 8/1958 | Kinkel | 318/32 |
| 2,850,697 | 9/1958 | Little, Jr. | 324/209 X |
| 2,912,642 | 11/1959 | Dahle | 324/34 |
| 3,184,963 | 5/1965 | Dahle | 73/88.5 |
| 3,750,010 | 7/1973 | Abnett et al. | 324/225 X |
| 4,232,265 | 11/1980 | Smirnov | 324/260 |
| 4,321,535 | 3/1982 | Allen | 324/209 |
| 4,585,978 | 4/1986 | Hasselmark et al. | 318/118 |
| 4,606,231 | 8/1986 | Beling | 73/766 X |
| 4,684,888 | 8/1987 | Tabak | 324/225 X |
| 4,823,053 | 4/1989 | McCracken et al. | 318/118 X |

FOREIGN PATENT DOCUMENTS

| | | | |
|---|---|---|---|
| 442441 | 2/1936 | United Kingdom | 324/209 |
| 2188157 | 9/1987 | United Kingdom | 324/209 |

OTHER PUBLICATIONS

Klokholm, E. Instrument for Measuring Magnetorestriction, IBM Tech. Discl. Bulletin, vol. 19, No. 10, Mar. 1977, pp. 4030, 4031.

Butler, "Application Manual for the Design of Etrema Terfenol-D Magnetostrictive Transducers," Edge Technologies, Inc., Etrema Division, Ames, Ia. (1988).

Primary Examiner—Gerard R. Strecker
Attorney, Agent, or Firm—Marshall, O'Toole, Gerstein, Murray & Bicknell

[57] ABSTRACT

Apparatus and method for precisely controlling the movement of a magnetostrictive transducer including an elongated magnetostrictive rod, means for inducing a magnetic field in the rod and supplying drive current for moving the rod in response to the drive current. A temperature compensated strain sensor configuration on the rod detects the amount of rod movement in response to the drive current and provides an output signal proportionate thereto. Feedback control means coupled between the strain sensor and the current driver respond to the strain sensor output signal and vary the drive current until the strain sensor output signal matches the voltage reference set point developing the drive current.

8 Claims, 1 Drawing Sheet

MEASUREMENT AND CONTROL OF MAGNETOSTRICTIVE TRANSDUCER MOTION USING STRAIN SENSORS

This invention relates to apparatus for the precision control of micro movements, and in particular to the precision control of the elongation of a magnetostrictive rod.

BACKGROUND OF THE INVENTION

Reference may be made to the following U.S. Pat. of interest Nos.: 3,184,963; 2,912,642; 2,849,669; 2,298,216; 2,275,532; 2,231,702; 2,183,078; 2,053,560.

Magnetostrictive material produces mechanical strains in response to a magnetic field produced by current in a coil surrounding the material. U.S. Pat. Nos. 2,912,642 and 3,184,963 disclose means for measuring the mechanical stresses in magnetostrictive material. In the disclosed systems, a mechanical force acting on the magnetostrictive material causes a distortion of the magnetic field. Means are provided for detecting the deformation of the magnetic field utilizing voltages induced in pickup coils so that the resulting detected pickup current is proportional to the applied mechanical force on the magnetostrictive material.

It is also known that varying the current in the coil surrounding the magnetostrictive material varies the induced strain and thereby causes very small changes in the dimensions of the magnetostrictive material. Accordingly, it has been proposed to calibrate the variation in coil input current versus the very small displacement of the magnetostrictive material so that such an arrangement could be used as a micro positioner. However, such a system has been found very difficult to calibrate due to a hysteresis effect, temperature variations, etc. For precision positioning devices using magnetostrictive material, i.e., micropositioning devices wherein the movement is in the range of 0.000001–0.010 inch (0.0000025–0.025 cm), the effects of hysteresis must be taken into consideration. Similarly, the effects of temperature variations on the amount of displacement of the magnetostrictive material in response to the input coil current must also be taken into account.

Accordingly, it is desired to provide apparatus and a method for measuring and/or controlling the motion of a magnetostrictive transducer so that such a transducer can be used as a micro-positioner device for use in applications requiring precise movement of components.

SUMMARY OF THE INVENTION

In accordance with the principles of the present invention, apparatus and a method are provided for controlling the movement of a magnetostrictive transducer in the form of an elongated rod of magnetostrictive material. Means are provided for inducing a magnetic field in the rod including a magnetic coil surrounding the rod and a current driver supplying drive current to the coil for elongating the rod in response to changes in a set point input to the drive current. Strain sensor means are provided on the rod for detecting the amount of rod movement in response to the drive current and providing an output signal while also compensating for any temperature variations. Feedback control means are coupled between the strain sensor means and the current driver for responding to the strain sensor means output signal and varying the coil drive current until the strain sensor output signal matches the reference set point.

The strain sensor means includes a first quartz resonant type strain sensor having both ends attached to the magnetostrictive rod. A second quartz resonant type strain sensor is attached by one end only at a position on the rod opposite of the first sensor. Applying an input current to the coil produces a strain in the rod and thereby elongates it in one direction. This produces a strain in the first sensor to increase the resonant frequency of the first sensor proportionate to the strain. Because the second sensor is only attached at one end, its resonant frequency is unchanged and can, therefore, be used for reference or temperature compensation.

A precise measurement and/or control of elongation is provided by algebraic linearization of the strain sensor frequency, $F_S$, and algebraic compensation for temperature from the temperature sensor frequency, $F_R$. The resulting compensated resonant frequency, $F_c$, is converted to a DC voltage, $V_F$, and amplified to produce a corresponding feedback coil current which continues to elongate the rod until the resulting feedback voltage, $V_F$, matches the control voltage set point input, $V_{SP}$, to the current driver which corresponds to the amount of elongation desired.

The two strain gage sensors and their respective mounting on the rod in addition to the feedback control means compensates for temperature variations and eliminates the hysteresis effect so as to provide micropositioning precision control of the elongation of the magnetostrictive rod.

BRIEF DESCRIPTION OF THE DRAWINGS

The features of this invention which are believed to be novel are set forth with particularity in the appended claims. The invention may be best understood by reference to the following description taken in conjunction with the accompanying drawings, in which like reference numerals identify like elements in the several figures and in which:

DETAILED DESCRIPTION

Figure 1:
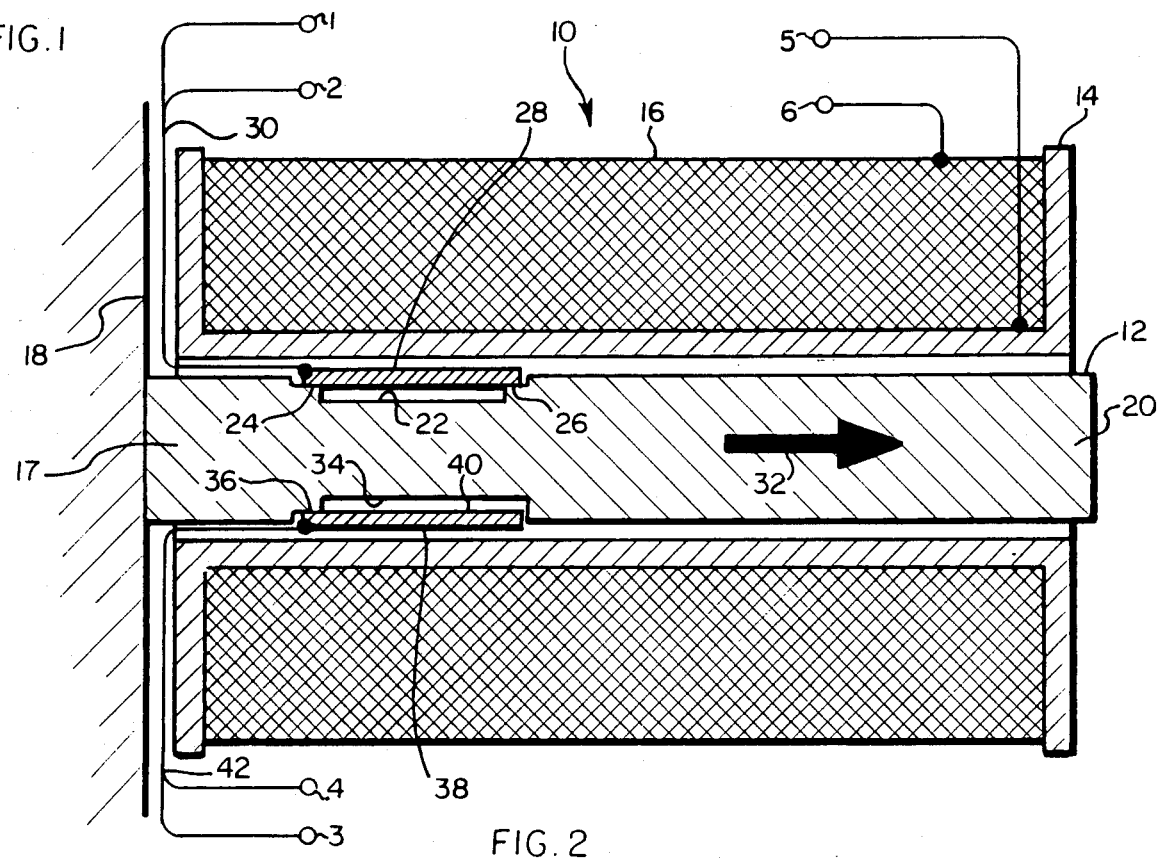
FIG. 1 is a schematic diagram illustrating the micropositioning device of the present invention utilizing a magnetostrictive transducer.

In accordance with the principles of the present invention, there is provided a micro-positioning device 10 which includes an elongated rod 12 formed of a magnetostrictive material. Such magnetostrictive material is well known and is normally formed of alloys of rare earth elements with iron. Presently available rare earth magnetostrictive materials produce large strains up to approximately 2,000 ppm (parts per million) for an imposed magnetic field as a result of a current in a surrounding coil. In particular, it is preferred that rod 12 be formed of a magnetostrictive material sold with the trademark "TERFENOL-D", which is currently available from Edge Technologies, Inc. of Ames, Ia.

A coil form 14 surrounds rod 12 and supports a magnetic wire coil 16. Coil 16 includes terminals 5, 6 for connecting the coil to a source of drive current. Rod end 17 is rigidly mounted to a fixed platform or base 18 whereas the opposite rod end 20 is free to move. Accordingly, as is known, coupling of a drive current to magnetic coil terminals 5, 6 creates a magnetic field which causes large strains in rod 12 to thereby cause rod end 20 to move in the direction of the reference arrow 32 shown in FIG. 1 away from base 18.

Rod 12 includes a first cavity 22 formed in the rod with opposite shoulders 24, 26 for supporting a linear strain gage 28. The opposite ends of strain gage 28 are mounted on respective shoulders 24, 26 and rigidly attached thereto so as to extend over cavity 22. It is preferred that strain sensor 28 is a quartz resonant type which is coupled from the sensor on line 30 to sensor output terminals 1, 2.

Accordingly, when an electric drive current is coupled to terminals 5, 6 and passed through magnetic coil 16, a strain is produced in magnetostrictive rod 12 so as to elongate the rod in the direction of the reference arrow 32. Rod elongation produces a corresponding strain in quartz sensor 28 which increases the sensor resonant frequency proportional to the strain. The increase in sensor resonant frequency is coupled to sensor output lines 1, 2.

Immediately opposite cavity 22 on rod 12, there is provided a second cavity 34 having a shoulder 36 only at one end. A second quartz strain gage sensor 38 has one end rigidly mounted and attached to shoulder 36 while the other end of sensor 38 is not attached to rod 12. Thus, as can be seen in FIG. 1, sensor 38 extends from the fixed end on shoulder 36 across cavity 34 and with the free end 40 remaining above the cavity floor.

Since sensor 38 is only attached at one end, its resonant frequency is unchanged and can, therefore, be used for reference or temperature compensation. The resonant frequency of sensor 38 is coupled on line 42 to sensor output terminals 3, 4.

Figure 2:
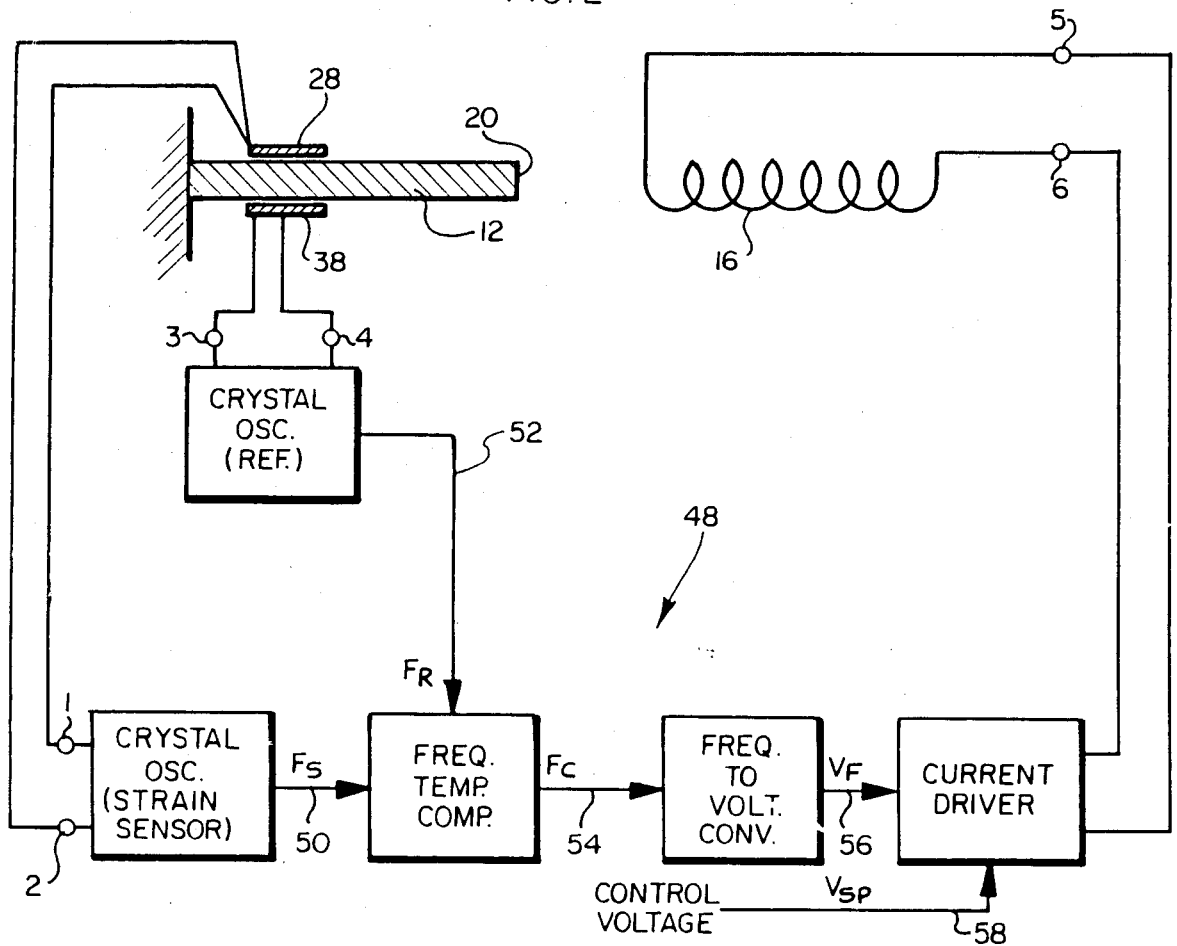
FIG. 2 is a schematic block diagram illustrating the apparatus and method for controlling the movement of a magnetostrictive transducer in accordance with the principles of the present invention.

Reference may now be had to FIG. 2 in which there is illustrated a micro-positioning device 10 for precisely controlling the position of magnetostrictive rod 12 in accordance with the principles of the present invention. As illustrated in FIG. 2, in response to variation of a control voltage input, $V_{SP}$, to a Current Driver, a corresponding current, I, will be coupled to terminals 5, 6 and thereby to magnetic coil 16 which will cause rod 12 to elongate. Strain sensor 28 provides a change in resonant frequency $F_S$ on line 50 which is proportional to the elongation strain in rod 12 due to the control voltage.

Strain sensor 38 provides an unchanged resonant frequency $F_R$ on line 52 so that the output of a Frequency-Temperature Compensation circuit is frequency $F_C$ on line 54. The Frequency-Temperature Compensator circuit provides the output frequency, $F_C$, resulting from algebraic linearization of the strain sensor frequency, $F_S$, and algebraic compensation for temperature from the temperature sensor frequency, $F_R$, so that, $$F_C = \sum_{I=0}^{N} A_I F_S^I + \sum_{J=0}^{M} B_J F_R^J$$

, where A and B are coefficients in the expression.

Line 54 is coupled to a Frequency to Voltage Converter whose output on line 56 is a voltage, $V_F$, which is proportional to the strain. The Frequency To Voltage Converter provides the output voltage, $V_F$, as a linear function of the input frequency, $F_C$, so that, $$V_F = K_1 F_C + K_0$$

where $K_1$ and $K_0$ are constants in the expression. Voltage $V_F$ is coupled to the input of the Current Driver which also receives an input on line 58 from the Control Voltage thereby providing changes in the set point of the Current Driver for selectively elongating rod 12.

The feedback control signal, $V_F$, on line 56 continues to develop drive current to coil 16 until the levels on lines 56 and 58 are matched at which point the variations of the Current Driver output will cease. Accordingly, end 20 of rod 12 is very precisely positioned in response to variations of the set point control voltage, $V_{SP}$, on line 58 and maintained in the desired position by means of feedback control 48.

The Frequency-Temperature Compensator circuit and the Frequency to Voltage Converter can be provided in the form of well-known analog circuits. Alternatively, conventional microprocessor based digital integrated circuits may be used.

The micro-positioning device 10 can be used for any situation in which precise motion and position is required such as in machine tooling, laser beam positioning, etc. Such micro-positioning of an object attached to rod 12, such as a laser mirror, can be set to within 0.000001 inch (0.0000025 cm) and where the total movement of rod 12 may be in the range of 0.000001 to 0.001 inch (0.0000025–0.0025 cm). Other applications may be utilized of the present invention in which the strain on sensor 28 is directly proportional to the position of rod 12. In certain situations it is preferred to preload rod 12 against base 18 such as with an initial compression of about 1,000 psi so as to obtain better elongation motion of rod 12. Standard commercially available quartz crystal oscillator strain sensors 28, 38, may be utilized. Alternatively, the quartz sensors described in U.S. Pat. Nos. 4,651,571 or 4,594,898 may be utilized.

The foregoing detailed description has been given for clearness of understanding only, and no unnecessary limitations should be understood therefrom, as modifications will be obvious to those skilled in the art.

I claim:

1. A micro-positioner device for precisely positioning and controlling the movement of a magnetostrictive transducer comprising;

an elongated magnetostrictive rod including means for rigidly mounting one rod end and enabling the opposite free rod end for micro-positionable elongated movement;

means for inducing a magnetic field in the rod, including a magnetic coil surrounding the rod and a current driver having a variable drive input set point for supplying drive current to the magnetic coil in response to the variable drive input set point for elongating said rod and micropositionally moving the free rod end;

strain sensor means including a first strain sensor device mounted on the rod for sensing the amount of strain due to said elongated rod movement and providing a feedback output signal proportional thereto, and a second strain sensor device mounted adjacent to said first sensor device for (1) responding to temperature variations in the environment around said first sensor device and providing a temperature compensation signal for said first strain sensor, and (2) not responding to the strain due to said elongated rod movement; and feedback control means having a control output signal and coupled between said strain sensor means and the current driver for responding to said feedback output signal from said first strain sensor and to said temperature compensation signal from said second strain sensor and varying the drive current until the control output signal matches the variable drive input set point so as to precisely position and control the free rod end.

2. Apparatus according to claim 1, wherein said strain sensors each comprise a quartz crystal.

3. Apparatus for controlling the movement of a magnetostrictive transducer comprising:
an elongated magnetostrictive rod including means for rigidly mounting one rod end and enabling the opposite free rod end for elongated movement;
means for inducing a magnetic field in the rod, including a magnetic coil surrounding the rod and a current driver having a variable drive input set point for supplying drive current to the magnetic oil in response to the variable drive input set point for elongating said rod and moving the free rod end;
strain sensor means including a first strain sensor mounted on the rod for sensing the amount of strain due to said elongated rod movement and providing a feedback output signal proportional thereto, and a second strain sensor oppositely mounted to said first strain sensor on said magnetostrictive rod for (1) responding to temperature variations in the environment around said first strain sensor and providing a temperature compensation signal for said first strain sensor, and (2) not responding to any strain due to said elongated rod movement;
said magnetostrictive rod including a first cavity and an opposite second cavity, and respective means for mounting said first sensor in said first cavity and said second sensor in said second cavity; and
feedback control means having a control output signal and coupled between said strain sensor means and the current driver for responding to said feedback output signal from said first strain sensor and said temperature compensation signal from said second strain sensor and varying the drive current until the control output signal matches the variable drive input set point so as to precisely position the free rod end.

4. Apparatus according to claim 3, wherein said first rain sensor is mounted across said first cavity respond to strains induced in said rod.

5. Apparatus according to claim 4, wherein said second strain sensor is mounted only to one end of said cavity so as to respond to temperature variations but not respond to strains induced in said rod.

6. Apparatus according to claim 5, wherein said strain sensors each comprise a quartz crystal, with said first sensor providing a first sensor resonant frequency proportional to the strain induced in the magnetostrictive rod.

7. Apparatus according to claim 6, wherein said second sensor provides a second sensor resonant frequency responsive to temperature variations but unchanged by the strain induced in the rod.

8. Apparatus according to claim 7, wherein said feedback control means includes frequency-temperature compensation means responsive to said first sensor resonant frequency and said second sensor resonant frequency to provide a linearized and temperature compensated output frequency which is proportional to the strain induced in the magnetostrictive rod and compensated for any temperature variations.

* * * * *